US006908859B2

(12) United States Patent
Pendharkar et al.

(10) Patent No.: US 6,908,859 B2
(45) Date of Patent: Jun. 21, 2005

(54) LOW LEAKAGE POWER TRANSISTOR AND METHOD OF FORMING

(75) Inventors: Sameer P. Pendharkar, Richardson, TX (US); Taylor R. Efland, Richardson, TX (US); William Nehrer, Soquel, CA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/267,264

(22) Filed: Oct. 8, 2002

(65) Prior Publication Data
US 2003/0073313 A1 Apr. 17, 2003

Related U.S. Application Data
(60) Provisional application No. 60/329,093, filed on Oct. 12, 2001.

(51) Int. Cl.[7] .............................................. H01L 21/302
(52) U.S. Cl. ..................... 438/689; 438/527; 438/228; 438/247; 438/252; 438/224; 438/687; 438/688
(58) Field of Search ................................ 438/687, 688, 438/689, 527, 228, 247, 252, 231, 258, 186; 257/313, 314, 315

(56) References Cited

U.S. PATENT DOCUMENTS

| 4,260,431 | A | * | 4/1981 | Piotrowski | ................... | 148/1.5 |
| 5,132,235 | A | * | 7/1992 | Williams et al. | ............ | 438/294 |
| 6,211,003 | B1 | * | 4/2001 | Taniguchi et al. | .......... | 438/228 |
| 6,413,810 | B1 | * | 7/2002 | Matsuhashi | ................. | 438/231 |
| 2002/0185673 | A1 | * | 12/2002 | Hsu et al. | .................... | 257/314 |
| 2002/0197779 | A1 | * | 12/2002 | Evans | ........................ | 438/186 |
| 2003/0003660 | A1 | * | 1/2003 | Hsu et al. | ................... | 438/258 |

OTHER PUBLICATIONS

Power BICMOS Process with High Voltage Device Implementation for 20V Mixed Signal Circuit Applications, Nehrer et al., Proceedings of 2001 International Symposium on Power Semiconductor Devices & ICs, Osaka, pp. 263–266.

* cited by examiner

*Primary Examiner*—Nathan J. Flynn
*Assistant Examiner*—Fazli Erdem
(74) *Attorney, Agent, or Firm*—Yingsheng Tung; Wade James Brady, III; Frederick J. Telecky, Jr.

(57) ABSTRACT

A transistor is formed in a semiconductor substrate. A deep n-well region is used in conjunction with a shallow n-well region. A lightly doped drain extension region is disposed between a drain region and a gate conductor. The use of the regions and against the backdrop of region provides for a very high breakdown voltage as compared to a relatively low channel resistance for the device.

12 Claims, 2 Drawing Sheets

LOW LEAKAGE POWER TRANSISTOR AND METHOD OF FORMING

This application claims priority under 35 USC 119(e)(1) of provisional application No. 60/329,093 filed Oct. 12, 2001.

TECHNICAL FIELD OF THE INVENTION

This invention relates in general to the field of semiconductor devices and, more particularly, to an improved low leakage power transistor and method of forming the same.

BACKGROUND OF THE INVENTION

Integrated semiconductor devices have found applications in a variety of systems which require large levels of power to be passed through the integrated circuit. For example, integrated circuits are used to provide drive current to electric motors that are used in a variety of applications including hard disk drives and floppy drives. In addition, integrated circuits are used to provide the switches which control the passage of power from a battery into the system it powers. In these contexts, the integrated circuit must be able to hold back a large amount of voltage with little or no leakage current. The leakage current of the integrated circuit in the power context is the chief parameter which determines how long the battery will stay charged when the system is not in use.

These integrated systems typically utilize a relatively robust field effect transistor that needs to provide a high breakdown voltage when the field effect transistor is in its non-conducting condition and a very low resistance when the field effect transistor is in its conducting condition. These two parameters are difficult to balance as the typical techniques used to reduce the resistance of the transistor will adversely affect its breakdown voltage and vice versa.

SUMMARY OF THE INVENTION

Accordingly, a need has arisen for a low leakage power transistor that addresses the problems and concerns of prior systems.

In accordance with the teachings of the present invention, various embodiments of a power transistor are described which substantially eliminate or reduce problems associated with prior transistor construction and methods of formation.

According to one embodiment of the present invention, a method for forming a power transistor is described which comprises implanting a deep n-type well into the outer surface of a semiconductor layer. A shallow n-well is then implanted into the deep n-well. A gate stack is then patterned and disposed outwardly from the outer surface of the semiconductor layer. A lightly doped drain extension implant is then performed self-aligned to the edge of the gate stack. A P-type contact implant is then performed to form the source and drain conductive regions of the field effect device.

An important technical advantage of the present invention inheres in the fact that the multiple implantation steps result in a relatively high threshold voltage with a relatively low channel resistance. This is accomplished by having a graded amount of impurities through the channel of the device using the various implant steps.

BRIEF DESCRIPTION OF THE DRAWINGS

A more complete understanding of the teachings of the present invention may be acquired by referring to the accompanying figures which like reference numbers indicate like features and wherein.

DETAILED DESCRIPTION OF THE DRAWINGS

Figure 1A:
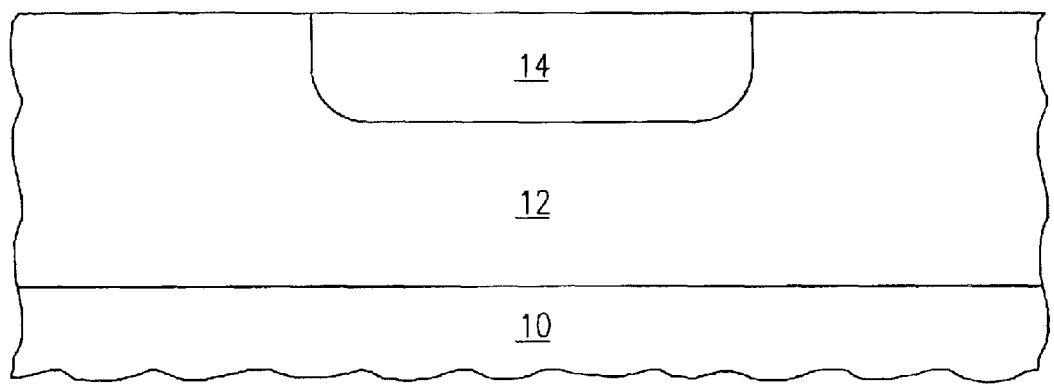
FIGS. 1A through 1D are greatly enlarged cross-sectional elevational diagrams illustrating one possible method of constructing a field effect transistor according to the teachings of the present invention.

FIG. 1A illustrates a semiconductor substrate 10 which may comprise for example an epitaxial layer of silicon which has been doped with p-type impurities such as boron to a concentration on the order of 2E15 ions/cm$^3$. An ion implantation process is then performed on substrate 10 to form a deep n-well 12 shown in FIG. 1A. Deep n-well 12 may be formed by implanting phosphorous ions at a dose of 3.7E12 ions/cm$^2$ at an energy of approximately 150 KeV. Alternate embodiments of the present invention may use implant doses ranging from 3.0E12 to 4.5E12 ions/cm$^2$. After the implant process, the substrate can be annealed at 1100° C. for 450 minutes in order to drive the ions into the substrate 10 to form deep n-well 12.

A second ion implantation process can then be used to form shallow n-well 14. Shallow n-well 14 can be formed by implanting phosphorous ions at a dose of on the order of 6E12 ions/cm$^2$ at an energy of 60 KeV. Alternate embodiments of the present invention may use implant doses ranging from 4.8E12 to 7.2E12 ions/cm$^2$. The substrate is then subjected to an anneal process on the order of 1100° C. for on the order of 100 minutes to form shallow n-well 14. These two anneal steps will result in the concentration profile shown in FIG. 1A.

Figure 1B:
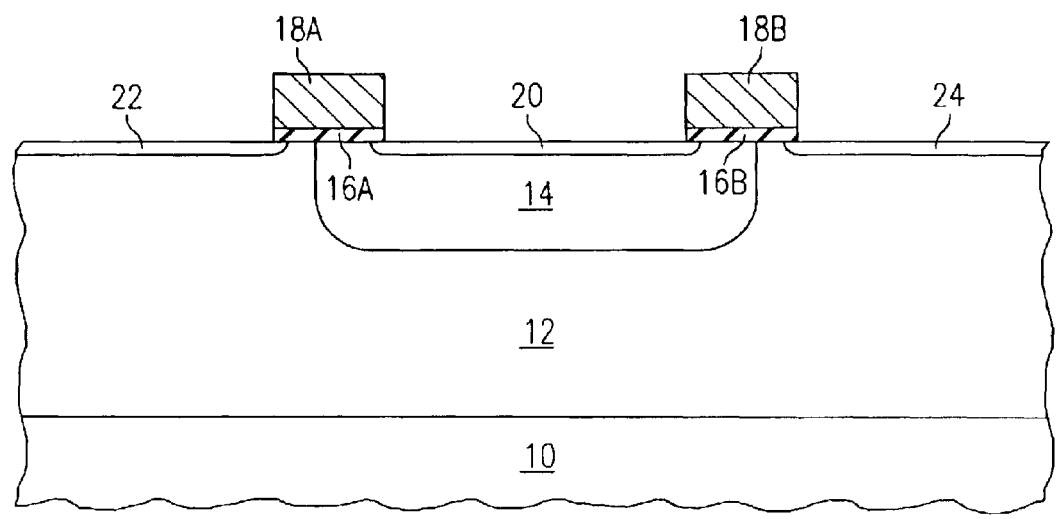

Referring to FIG. 1B, a gate conductor is then formed outwardly from the outer surface of substrate 10. A gate conductor is formed by growing a gate insulator layer (full layer not shown) comprising on the order of 300 Å of, for example, silicon dioxide. A layer of polycrystalline silicon on the order of 2700 Å in thickness is then deposited outwardly from the outer surface of the gate insulator layer. These two layers are then patterned and etched using conventional photolithographic techniques to form gate insulator layer 16A and 16B and gate conductor layers 18A and 18B shown in FIG. 1B. Gate conductor layer 18A and 18B are doped with sufficient ionic impurities during their formation to render them conductive.

The resulting structure is then subjected to a lightly doped drain extension implant process which forms drain extension regions 20 and source extension regions 22 and 24 shown in FIG. 1B. This implant process may comprise the implantation of boron ions at a dose of on the order of 9E12 ions/cm$^2$ at an energy of approximately 30 KeV. Alternate embodiments of the present invention may use implant doses ranging from 7.2E12 to 1.1E13 ions/cm$^2$. This implant may be subjected to a light anneal process or may not be annealed at this stage in order to prevent the ions within these regions from migrating too far beneath the gate conductors 18A and 18B. In this manner, the channel width of the ultimate field effect device can be controlled more carefully. It should be noted that the lightly doped drain extension implant process is self-aligned to the edges of gate conductors 18A and 18B and as such does not rely on the formation of a photolithographically-formed mass structure.

Figure 1C:
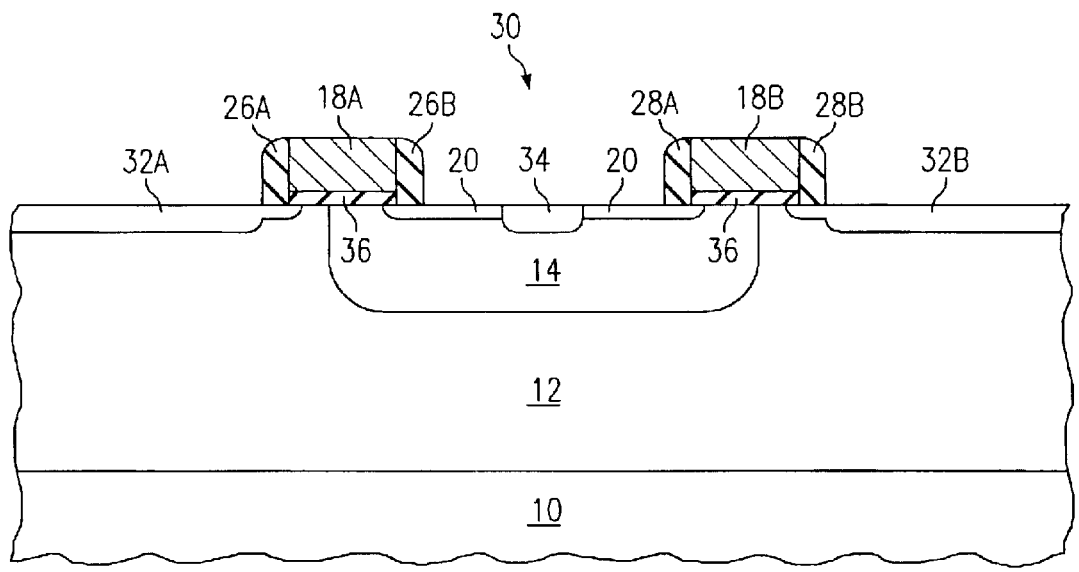

Referring to FIG. 1C, sidewall insulator bodies 26A and 26B and 28A and 28B are formed using the conventional processes by depositing a conformal layer of silicon dioxide or silicon nitride covering the outer surface of substrate 10 and the outer surfaces of gate conductors 18A and 18B. This layer is then anisotropically etched resulting in the structure shown in FIG. 1C. The resulting structure is then subjected to a source drain implant process which is photolithographically defined at the center of a drain region indicated generally at 30 and is self-aligned to the outer edges of sidewall insulator body 26A and sidewall insulator body 28B shown in FIG. 1C. This implant process may comprise for example the implantation of boron ions at a dose of on the order of 2E14 ions/cm$^2$ at an energy on the order of 20 KeV. Alternate embodiments of the present invention may use implant doses ranging from 1.6E14 to 2.4E14 ions/cm$^2$. This implantation process is then followed by an anneal process at a temperature on the order of 900° C. for a period of time on the order of 60 minutes. These processes result in the formation of source regions 32A and 32B and drain contact region 34. According to one embodiment of the present invention, the outer regions of drain contact region 34 are on the order of 9000 Å from the inner edge of the lightly doped drain extension 20. Further according to this embodiment, the channel region indicated generally at 36 is on the order of 9000 Å in width.

Figure 1D:
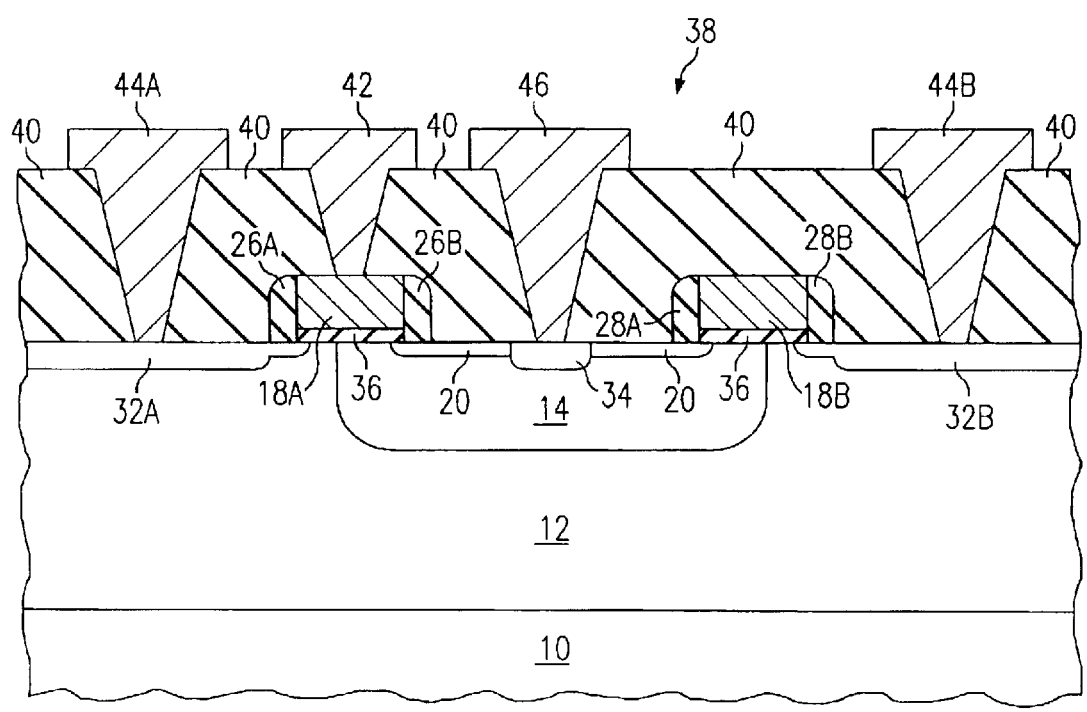

The final structure of a field effect device indicated generally at 38 is shown in FIG. 1D. Device 38 is completed by depositing an isolation insulator layer 40 covering the outer surface of the structures formed. Openings in layer 40 are then made using conventional photolithographic processes and the openings are filled by a gate contact 42, source contacts 44A and 44B and a drain contact 46. Isolator insulator layer 40 may comprise for example silicon dioxide and contacts 42, 44A, 44B and 46 may comprise for example a suitable conductor such as aluminum or copper.

The structure illustrated in FIG. 1D utilizes a drain region that enjoys a graded amount of dopant. This gradual decrease of dopant concentration moving towards the channel region provides for a much higher breakdown voltages than in other conventional architectures. Further, this drain region is set against a shallow n-well implant so that the difference between the ion implantation of the drain region and the background substrate is much less. The use of these implant processes provides for a reduced surface field effect that provides for a dramatically greater breakdown voltage for a device that has a relatively low channel resistance when operating in the conductive state. For example, the architecture shown may result in a device having a breakdown voltage between source and drain of on the order of 19 to 20 volts at a gate source voltage of zero. This device also can exhibit an on-state resistance as low as on the order of 0.4 to 0.5 mohms-cm$^2$. This is a dramatic improvement over other device architectures which can exhibit twice as high channel resistances if the breakdown voltage of 20 volts is viewed as a constant parameter.

The device 30 shown in FIG. 1D is illustrated with a pair of gate conductors 18A and 18B. It should be understood that the architecture is easily scaled to accommodate larger current needs by merely replicating the number of gate conductors. In this manner, virtually any required current need can be accomplished by replicating and interconnecting parallel gate conductors over the surface of a substrate.

Device 38 is shown with a pair of gate conductors 18A and 18B. It should be understood that the architecture disclosed herein may be applied to a single gate conductor or many gate conductors operating in parallel. For example, a technique such as a circular gate surrounding the drain region could be used advantageously with the architecture disclosed. In this manner, gate conductors 18A and 18B are both portions of the circular structure. Alternatively, the gate conductors could be structured like fingers off of a comb and connected at one end of the long strips of gate conductors. Alternatively, the gate conductors could be independent structures which are connected using an outwardly disposed inter-level metal layer. In this architecture, the gate conductor 18B would have an additional contact formed between contacts 46 and 44B shown in FIG. 1D. Those skilled in the art will recognize that a variety of other techniques may be used to scale the architecture of the present invention to any required application.

Although the present invention has been described in detail, it should be understood the various changes, modifications, alterations and substitutions may be made in the embodiments disclosed herein without departing from the spirit of the present invention, the scope of which is solely defined by the appended claims.

What is claimed is:

1. A method of forming a field affect transistor proximate the outer surface of a semiconductor substrate, comprising:
   forming a deep n-well by implanting n-type impurities through the outer surface of the semiconductor substrate;
   forming a shallow n-well by implanting n-type impurities through the outer surface of the semiconductor substrate such that the shallow n-well is formed in the area of the substrate defined by the deep n-well;
   forming a gate conductor insulatively disposed adjacent the outer surface of the semiconductor substrate proximate the shallow n-well;
   forming a lightly doped drain extension within the shallow n-well region and proximate one edge of the gate conductor, the lightly doped drain extension region formed by implanting p-type ions into the outer surface of the semiconductor substrate; and
   forming a drain region in the shallow n-well region adjacent to the lightly doped drain extension region and spaced apart from one edge of the gate conductor by the lightly doped drain extension, the drain region formed by implanting p-type ions into the outer surface of the semiconductor substrate.

2. The method of claim 1 wherein the formation of the deep n-well and shallow n-well regions comprises the step of implanting phosphorous ions.

3. The method of claim 2 wherein the step of forming the deep n-well region comprises the step of implanting phosphorous ions at a dose of about 3.7E12 ions/cm$^2$ at an energy of about 150 KeV.

4. The method of claim 2 wherein the step of forming the shallow n-well region comprises the step of implanting phosphorous ions at a dose of about 6E12 ions/cm$^2$ at an energy of about 60 KeV.

5. The method of claim 2 wherein the formation of the deep n-well and the shallow n-well comprise the step of annealing the substrate following the implantation of ions.

6. The method of claim 1 and further comprising the step of forming sidewall insulator bodies adjacent the outer edges of the gate conductor prior to the implantation step used to form the drain region.

7. The method of claim 1 wherein the implantation process used to form the drain region also operable to form a source region proximate an outer edge of one of the sidewall insulator bodies.

8. A method of forming a field affect transistor proximate the outer surface of a semiconductor substrate, comprising:
   forming a deep n-well by implanting phosphorous ions through the outer surface of the semiconductor substrate;
   forming a shallow n-well by implanting phosphorous ions through the outer surface of the semiconductor substrate such that the shallow n-well is formed in the area of the substrate defined by the deep n-well;

forming a gate conductor insulatively disposed adjacent the outer surface of the semiconductor substrate proximate the shallow n-well;

forming a lightly doped drain extension within the shallow n-well region and proximate one edge of the gate conductor, the lightly doped drain extension region formed by implanting boron ions into the outer surface of the semiconductor substrate; and forming a drain region in the shallow n-well region adjacent to the lightly doped drain extension region and spaced apart from one edge of the gate conductor by the lightly doped drain extension, the drain region formed by implanting p-type ions into the outer surface of the semiconductor substrate.

9. The method of claim 8 wherein the step of forming the deep n-well region comprises the step of implanting phosphorous ions at a dose of about 3.7E12 ions/cm$^2$ at an energy of about 150 KeV.

10. The method of claim 8 wherein the step of forming the shallow n-well region comprises the step of implanting phosphorous ions at a dose of about 6E12 ions/cm$^2$ at an energy of about 60 KeV.

11. The method of claim 8 wherein the formation of the deep n-well and the shallow n-well comprise the step of annealing the substrate following the implantation of ions.

12. The method of claim 8 and further comprising the step of forming sidewall insulator bodies adjacent the outer edges of the gate conductor prior to the implantation step used to form the drain region, the implantation process used to form drain region also operable to form a source region proximate an outer edge of one of the sidewall insulator bodies.

* * * * *